United States Patent
Yuenyongsgool et al.

(10) Patent No.: US 12,512,822 B2
(45) Date of Patent: Dec. 30, 2025

(54) OVERRIDE MECHANISM FOR PWM OPERATION

(71) Applicant: Microchip Technology Incorporated, Chandler, AZ (US)

(72) Inventors: Yong Yuenyongsgool, Gilbert, AZ (US); Andreas Reiter, Feldkirchen-Westerham (DE); Stephen Bowling, Chandler, AZ (US); Jason Sachs, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 39 days.

(21) Appl. No.: 18/432,347

(22) Filed: Feb. 5, 2024

(65) Prior Publication Data

US 2024/0275366 A1    Aug. 15, 2024

Related U.S. Application Data

(60) Provisional application No. 63/444,505, filed on Feb. 9, 2023.

(51) Int. Cl.
    *H03K 3/017*    (2006.01)
(52) U.S. Cl.
    CPC .................................... *H03K 3/017* (2013.01)
(58) Field of Classification Search
    CPC .............................. H03K 3/017; H03K 5/151
    See application file for complete search history.

(56) References Cited

U.S. PATENT DOCUMENTS

| | | | | |
|---|---|---|---|---|
| 6,150,879 A | * | 11/2000 | Watanabe ............ | H03K 5/1515 327/147 |
| 2002/0181577 A1 | * | 12/2002 | Bowling ................. | H02P 27/08 375/238 |
| 2010/0226159 A1 | * | 9/2010 | Stern .................... | H02M 7/5395 363/132 |
| 2022/0302904 A1 | | 9/2022 | Yuenyongsgool et al. | |

FOREIGN PATENT DOCUMENTS

EP          0606912 B1      7/1994     ............... H03K 5/15

OTHER PUBLICATIONS

International Search Report and Written Opinion, Application No. PCT/US2024/015110, 12 pages, Jun. 17, 2024.
"Pulse-Width Modulation: The Basic Principles Described," Wireless World: Radio and Electronics, vol. 11, No. 12, 3 pages, Dec. 1945.

* cited by examiner

*Primary Examiner* — Sibin Chen
(74) *Attorney, Agent, or Firm* — SLAYDEN GRUBERT BEARD PLLC (57) ABSTRACT

An apparatus includes a pulsed-width modulation (PWM) generator circuit to generate generally complementary PWM signals. The signals are to prevent two complementary switches that receive the complementary PWM signals from both being activated at a same time. The PWM signals are generally complementary with respect to their active portions. The apparatus includes an override circuit to override at least one of the complementary PWM signals to yield adjusted PWM signals. The adjusted PWM signals are to cause the two complementary switches to be activated at a same time when the adjusted PWM signals are received at the two complementary switches.

20 Claims, 10 Drawing Sheets

OVERRIDE MECHANISM FOR PWM OPERATION

PRIORITY

This application claims priority from U.S. Provisional Patent No. 63/444,505 filed Feb. 9, 2023, the contents of which are hereby incorporated in their entirety.

TECHNICAL FIELD

The present disclosure relates to pulsed-width modulation (PWM) generation and, more particularly, to an override mechanism for PWM operation in complementary mode.

BACKGROUND

Complementary mode PWM signal generation may be commonly used to operate a circuit of series connected transistors between positive and negative levels of a voltage rail. The most common transistor circuit configuration is two series-connected transistors (in a so-called half-bridge configuration). Hence, PWM generators of control devices, such as PWM controllers, microcontrollers and switching regulators, often provide a pair of signal generator outputs, one providing the control signal for the upper transistor (PWMH) and a complementary signal output for the lower transistor (PWML). If all series-connected transistors of such a circuit are conducting at the same time, this circuit configuration would short the voltage rail they are connected to, causing an undesired circuit condition such as a short, which could lead to severe damages of the circuit. Hence, complementary mode PWM signal generation commonly incorporates a protection circuit preventing the PWM logic from generating overlapping PWMH and PWML signals.

Inventors of examples of the present disclosure have discovered that this safety feature used in complementary mode PWM signal generation, may restrict certain applications, such as when complementary mode PWM generation is desired to drive transistor circuit configurations, where the transistors are not directly connecting the supply rail to ground, but are used to apply voltage across storage devices, such as an inductor or capacitor. In these applications, overlapping PWMH or PWML control signals or control signals which transition their respective signal levels simultaneously (critical complementary mode) would therefore not imply critical or unsafe operating conditions but are, in fact, may be used for ensuring proper circuit function. Thus, the built-in protection against overlapping control signals is limiting the usability of protected, complementary PWM generation.

Examples of the present disclosure may address one or more of these issues.

DETAILED DESCRIPTION

The present disclosure includes a circuit for selectively allowing or preventing the generation of overlapping, complementary PWM output signals without unintentionally jeopardizing the safety of the protected generation of non-overlapping signals in common complementary mode or disrupting the proper function of overlapping or critical complementary mode signal generation. For simplicity and clarity, examples and descriptions refer to a complementary mode PWM signal generation suited for N-type transistors, which are enabled by a logic high and disabled by a logic low control signal. However, PWM generators may also allow selectively changing or the configuration of PWM output signal polarity, allowing inversion of each generated PWM output signal individually. When not inverted, an ACTIVE state may result in the generation of a logic high signal at the output pin. When inverted, an ACTIVE state may result in the generation of a logic low with respect to its signal level to allow the use of P-type transistors as well as N-type transistors at each PWM signal output individually.

Figure 1A:
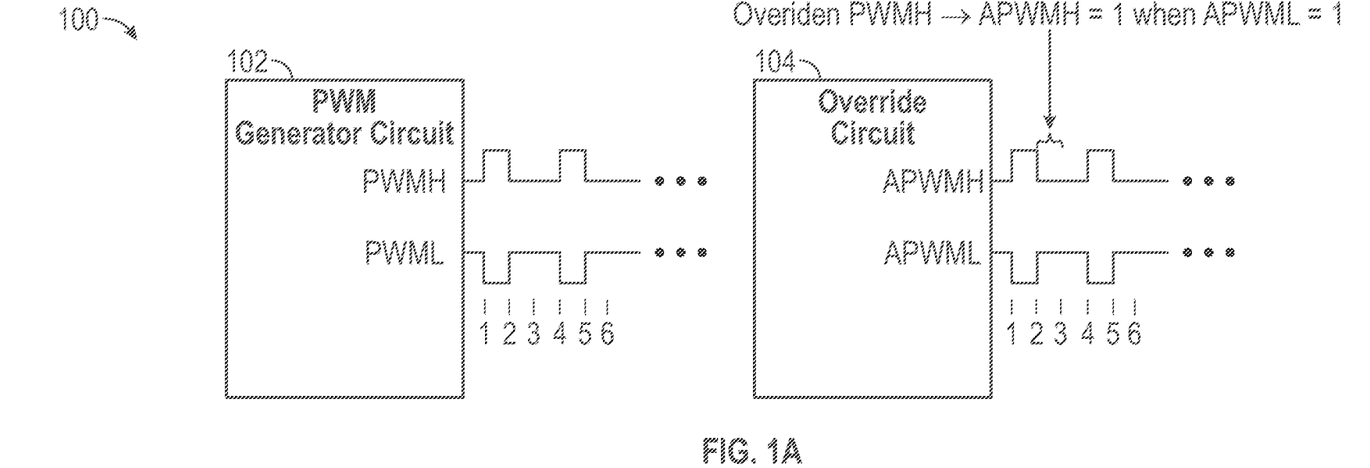
FIGS. 1A and 1B are illustrations of an example apparatus for override of PWM operation in complementary mode, according to examples of the present disclosure.
Figure 1B:
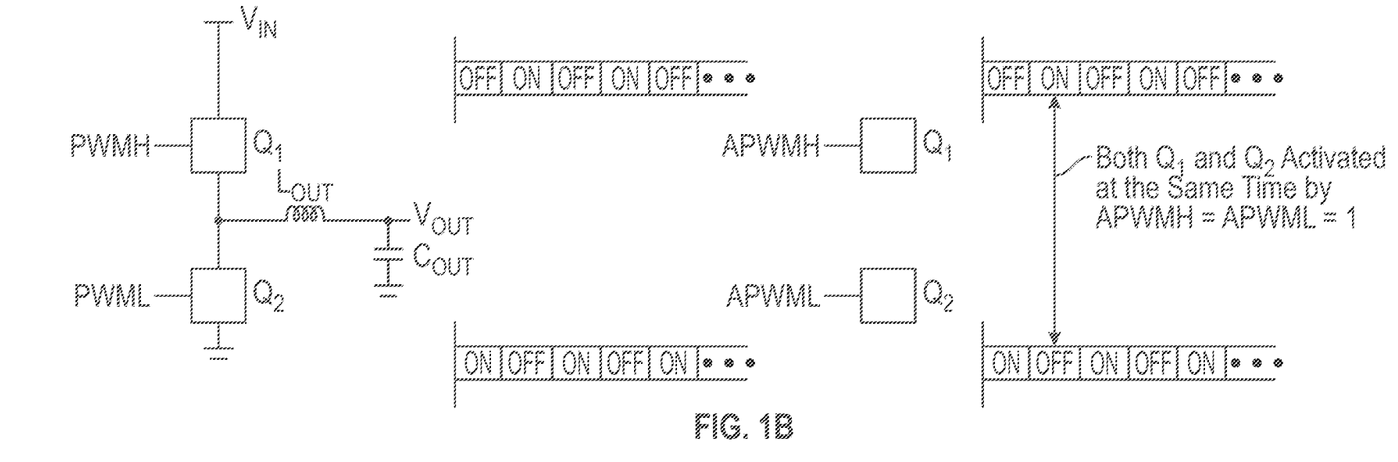

FIGS. 1A and 1B are illustrations of an example apparatus 100 for override of PWM operation in complementary mode, according to examples of the present disclosure.

Apparatus 100 may include a PWM generator circuit 102 and an override circuit 104. PWM generator circuit 102 may output PWM signals for complementary pairs of switches. In one example, PWM generator circuit 102 may output PWMH and PWML signals that are complementary, or nearly complementary, with respect to one another, without overlap between active portions of the PWMH and PWML signals.

In particular, PWM generator circuit 102 may generate PWM signals such that PWMH and PWML do not cause a complementary pair of switches receiving PWMH and PWML to both be active or transitioning at a same time. The PWM signals themselves may be complementary, or nearly complementary, with respect to one another, at least with respect to the active portions of the PWM signals. Although described as complementary, these signals may be mostly complementary, with exceptions, such as forced deadtime when both signals are to cause the corresponding complementary switches to be deactivated.

The enforced complementary nature of the PWMH and PWML signals generated by PWM generator circuit 102 with respect to the active portions of the PWM signals may be a safety feature, since in many applications, if both such switches are activate at a same time, then shoot-through conditions from power to ground may occur, for example. PWM generator circuit 102 may thus include forced complementary logic and forced deadtime logic. Moreover, PWM generator circuit 102 may enforce deadtime wherein both switches are to be off after receiving PWMH and PWML. Deadtime is understood to mean the time between a first edge of one signal changing from active to inactive and a second edge of the complementary signal changing from inactive to active.

Override circuit 104 may override the enforced complementary nature of PWMH and PWML signals with respect to the active portions of the PWM signals issued by PWM generator circuit 102, before such signals are passed to the complementary pair of switches. Override circuit 104 may override the PWMH and PWML signals to yield adjusted PWM signals. The adjusted PWM signals may be mostly complementary with respect to the active portions of the PWM signals, with exceptions, such as the override operations, or deadtime. The adjusted PWM signals may be given as APWMH and APWML. The adjusted PWM signals may be applied to the pair of complementary switches. The pair of complementary switches, upon receipt of the adjusted PWM signals APWMH and APWML, may be activated at a same time for at least a portion of a PWM time-base clock cycle. When override operations are enabled, override circuit 104 may override the enforced complementary nature of PWMH and PWML signals with respect to the active portions of the PWM signals for at least a portion of a PWM time-base clock cycle. When override operations are not enabled, override circuit 104 may pass PWMH and PWML signals as APWMH and APWML without changes.

Override circuit 104 may include a special configuration procedure requiring a specific sequence of software instructions to unlock or lock control registers before enabling or disabling the overrides are accepted by the PWM control logic. This additional protection against accidental overrides of the enforced complementary mode signal generation may only be required once, allowing fast state modifications by software commands or hardware signals during operation.

For example, in FIG. 1, PWM generator circuit 102 may generate PWMH and PWML signals from any suitable input (not shown). Such input may be read from memory such as a register or streamed from random access memory, received at apparatus 100 as a function call, or received as an input signal from another element of a system in which apparatus 100 is implemented. As shown, PWMH and PWML signals may be mostly complementary with respect to one another. Deadtime may be added in PWMH and PWML signals to ensure that during the actual switching on and off of the complementary pair of switches, that both switches are not activated at the same time. Thus, as shown in FIG. 1, PWMH and PWML signals might not both be active (that is, logic high for n-type transistors or logic low for p-type transistors) at the same time.

After receiving PWMH and PWML signals, override circuit 104 may selectively generate APWMH and APWML signals, if so enabled. The input (not shown) to override circuit 104 may specify whether the override operation is enabled, and a particular moment at which one or both of PWMH and PWML signals are to be overridden. Moreover, the input may specify a value that is to be used to override the PWMH or PWML signal. The value may be a predetermined value, such as a logic 1, so as to activate a respective one of the complementary switches. The input may be made from, for example, a software call made through a register to apparatus 100.

Override circuit 104 may override a portion of PWMH or PWML signals such that the overridden portion causes both PWMH and PWML signals to activate both of the complementary switches at the same time. As shown in FIG. 1, between times enumerated 2 and 3, PWMH signal was inactive and PWML signal was active. Based on enabled override functionality, and an indication to cause both PWM signals to be active between times enumerated 2 and 3, override circuit 104 may selectively cause PWMH signal to be overridden and be active between times enumerated 2 and 3, while maintaining PWML signal to be active between times enumerated 2 and 3. Thus, between times enumerated 2 and 3, the resultant APWMH and APWML signals may be both active and may be provided to the complementary switches, activating both of the complementary switches at during this time period, i.e. between times enumerated 2 and 3.

Multiple instances of apparatus 100 may exist in a given implementation or system. Moreover, apparatus 100 may be implemented with multiple instances of PWM generator circuit 102 and override circuit 104 to generate multiple PWM signal pairs to be provided to multiple complementary switches.

Shown in FIG. 1 are example switches Q1 and Q2, which may be arranged as shown in a series manner between a voltage input (VIN) and ground. A midpoint of Q1 and Q2 may be connected to a first lead of an output inductor (LOUT), with a second lead of output inductor (LOUT) connected to a voltage output (VOUT), across which voltage output (VOUT) an output capacitor (COUT) may be connected to ground. This is a simple example of a voltage regulator, wherein a constant, regulated voltage may be provided at VOUT. The constant regulated voltage may be provided according to the duty switching cycles of Q1 and Q2. Q1 and Q2 may be controlled by PWM signals that are generally complementary with respect to one another. PWM signals may be considered to be generally complementary with respect to one another even if both PWM signals are inactive at a same time, if the time for which such simultaneous inactivity is relatively small (such as less than 10% of a duty cycle of the PWM signals) or for purposes such as allowing jitter or other noise to be reduced. Commonly, in other applications, Q1 and Q2 might be prevented from both being switched on at a same time so as to prevent a direct path of current between VIN and ground. In other words, deadtime is provided to prevent shoot through.

For example, if PWMH and PWML signals as generated by PWM generator circuit 102 were used to control Q1 and Q2, between times 0 and 1, PWMH signal would be inactive and Q1 would be switched off while PWML signal is active and Q2 would be switched on; between times 1 and 2, PWMH signal would be active and Q1 would be switched on while PWML signal is inactive and Q2 would be switched off; between times 2 and 4, PWMH signal would be inactive and Q1 would be switched off while PWML signal is active and Q2 would be switched on; between times 4 and 5, PWMH signal would be active and Q1 would be switched on while PWML signal is inactive and Q2 would be switched off; and between times 5 and 6, PWMH signal would be inactive and Q1 would be switched off while PWML signal is active and Q2 would be switched on. There may be required deadtimes between the states. While the above has been described as the logic states and the switching of Q1 and Q2 occurring at times 1, 2, 4 and 5, it is to be understood that a deadtime is enforced by PWM generator circuit 102 between the falling edge of PWMH, or PWML signal and the immediate rising edge of PWML, or PWMH, signal respectively. The deadtime is not shown for simplicity.

In contrast, if APWMH and APWML signals were applied to Q1 and Q2—for example, in a different voltage regulator topology—at time 2, override circuit 104 may determine to override PWMH signal with an active value such that both PWM signals are to activate respective switches. Both Q1 and Q2 are activated in the time frame between times 2 and 3 by active signal values of APWMH and APWML signals. Similarly, the enforced deadtime may be overridden by override circuit 104.

In the present disclosure, the switches are described as being activated by an active input value, i.e. an active on the respective signal. This may occur when, for example, the switches are implemented using n-type field effect transistors (FET). However, one of skill will recognize that switches may be implemented using p-type FETs, for example, in which case an inactive input value may activate the switch. The present disclosure's teachings of override circuit 104 may be suitably adapted for override so as to cause active or inactive outputs for a given switch as needed to override safety features of signals generated by PWM generator circuit 102.

PWM generator circuit 102 and override circuit 104 may be implemented in any suitable manner, such as by analog circuitry, digital circuitry, instructions for execution by a processor (not shown), application specific integrated circuit, field programmable gate array, programmable logic, programmable hardware, programmable logic device, or any suitable combination thereof.

Figure 2:
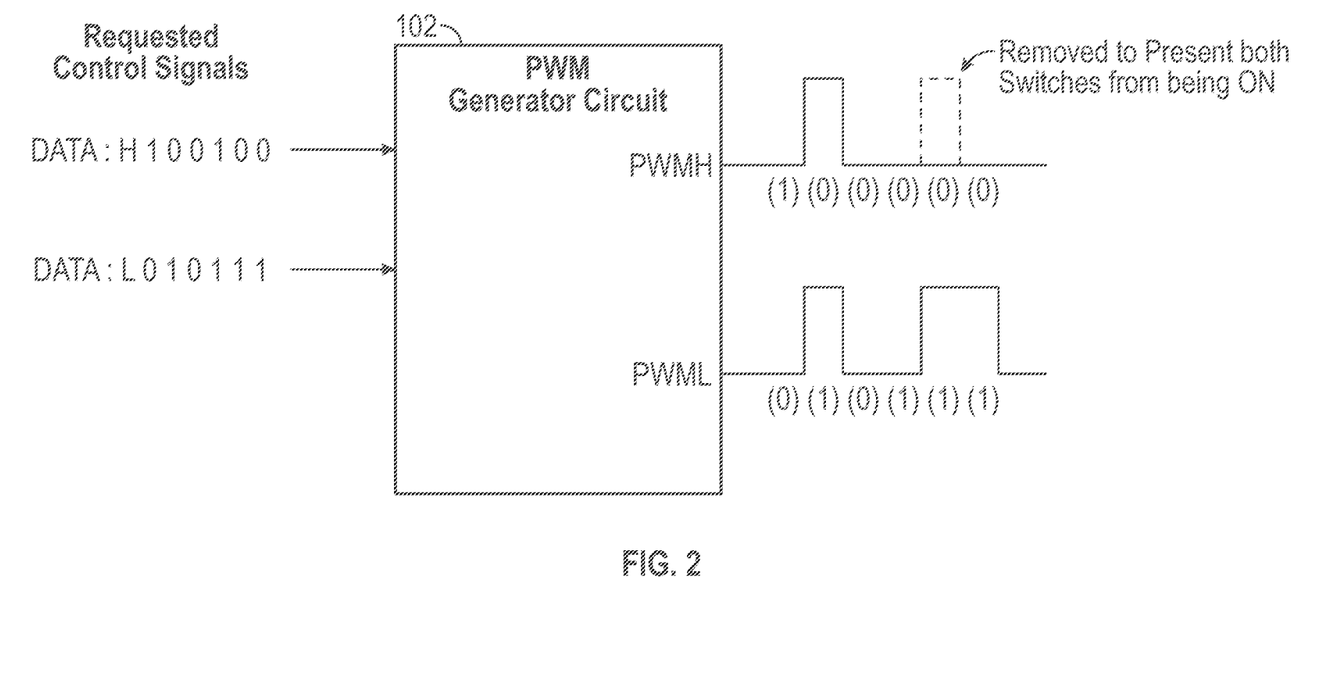
FIG. 2 is a more detailed illustration of operation of a PWM generator circuit, according to examples of the present disclosure.

FIG. 2 is a more detailed illustration of operation of PWM generator circuit 102, according to examples of the present disclosure.

Given a data input stream, such as for PWMH signals: {1, 0, 0, 1, 0, 0} and for PWML signals: {1, 0, 0, 1, 1, 0}, PWM generator circuit 102 may not output the fourth such data element in PWMH signal. This value may be removed to prevent both switches that receive PWML and PWMH signals from both being activated at a same time. As described in the present disclosure, this safety feature may be overridden by override circuit 104.

Figure 3:
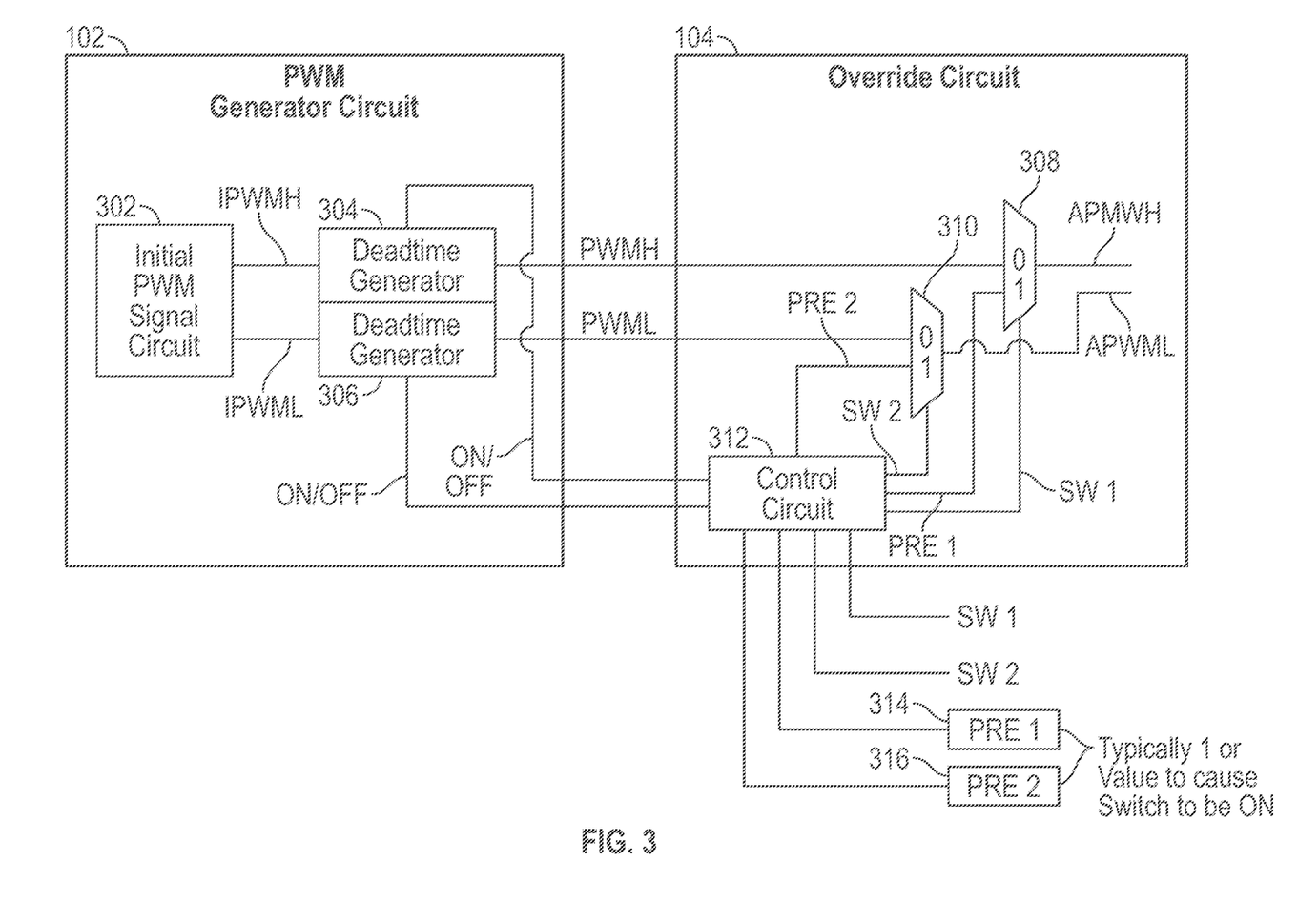
FIG. 3 is a more detailed illustration of an apparatus for override of PWM operation in complementary mode, according to examples of the present disclosure.

FIG. 3 is a more detailed illustration of apparatus 100 for override of PWM operation in complementary mode, according to examples of the present disclosure.

PWM generator circuit 102 may include an initial PWM signal circuit 302 to generate PWM signals based upon any suitable input. Initial PWM signal circuit 302 may generate complementary initial PWM signals, given as IPWMH and IPWML signals, implemented in a similar manner to PWMH and PWML signals described above.

In one example, PWM generator circuit 102 may include any suitable number and kind of deadtime generator circuits 304, 306. In another example, PWM generator circuit 102 may be configured to output IPWMH and IPWML signals to deadtime generator circuits 304, 306 implemented externally with respect to PWM generator circuit 102. Although described as two circuits, deadtime generator circuits 304, 306 may be implemented in a same circuit. Deadtime generator circuits 304, 306 may receive IPWMH and IPWML signals and output, respectively, PWMH and PWML signals. Deadtime generator circuits 304, 306 may delay or accelerate transitions between active and inactive in PWMH or PWML signals so as to enforce deadtime, wherein both PWMH and PWML signals are inactive or otherwise to cause both the complementary switches to be deactivated at a same time. Deadtime may be used, for example, as a safety feature to allow switches to fully transition from one state to another, as the physical limitations associated with particular implementations of a given switch do not allow a switch to be fully on or fully off in an instantaneous manner.

Deadtime generator circuits 304, 306 may be selectively enabled. Deadtime generator circuits 304, 306 may be selectively enabled by any suitable element, such as override circuit 104. If enabled, deadtime generator circuits 304, 306 may cause deadtime to be added to IPWMH and IPWML signals and issued as PWMH and PWML signals. If disabled, deadtime generator circuits 304, 306 may issue IPWMH and IPWML signals to be issued as PWMH and PWML signals, respectively.

Override circuit 104 may include control circuit 312. Control circuit 312 may control various operations of override circuit 104, as well as overriding the operation of deadtime generator circuits 304, 306.

Override circuit 104 may include any suitable analog circuitry, digital circuitry, instructions for execution by a processor (not shown), application specific integrated circuit, field programmable gate array, programmable logic, programmable hardware, programmable logic device, or any suitable combination thereof for causing override of one or more of PWMH and PWML signals. For example, override circuit 104 may include multiplexers 308, 310 to selectively override PWMH and PWML signals, respectively. Multiplexers 308, 310 may be controlled by control signals from control circuit 312. Multiplexer 308 may selectively switch between PWMH signal and a control value from control circuit 312 to output APWMH signal. Multiplexer 310 may selectively switch between PWML signal and a control value from control circuit 312 to output as APWML signal. The control value from control circuit 312 to be output as APWMH or APWML signal may be a predetermined value, shown as PRE1 or PRE2. The predetermined value may be one or active so as to cause the respective switch to be activated. Moreover, control circuit 312 may issue control signals to multiplexers 308, 310 to operate based upon a software instruction to override one of PWMH or PWML signals, shown as control signals SW1 and SW2, respectively. Control signals SW1 and SW2 may be read from, for example, a register or other suitable mechanism. Control signals SW1 and SW2 may define not only whether to override one of PWMH or PWML signals, but also for how long, and when. The control of selective operation of multiplexers 308, 310 are illustrated as based upon control signals SW1 and SW2, respectively.

Control circuit 312 may selectively turn deadtime generator circuits 304, 306 on or off. Control circuit 312 may, when overriding one of PWMH or PWML signals, turn off a corresponding one of deadtime generators 304, 306.

Control circuit 312, deadtime generator circuits 304, 306, and initial PWM signal circuit 302 may be implemented in any suitable manner, such as by analog circuitry, digital circuitry, instructions for execution by a processor (not shown), application specific integrated circuit, field programmable gate array, programmable logic, programmable hardware, programmable logic device, or any suitable combination thereof.

Figure 4:
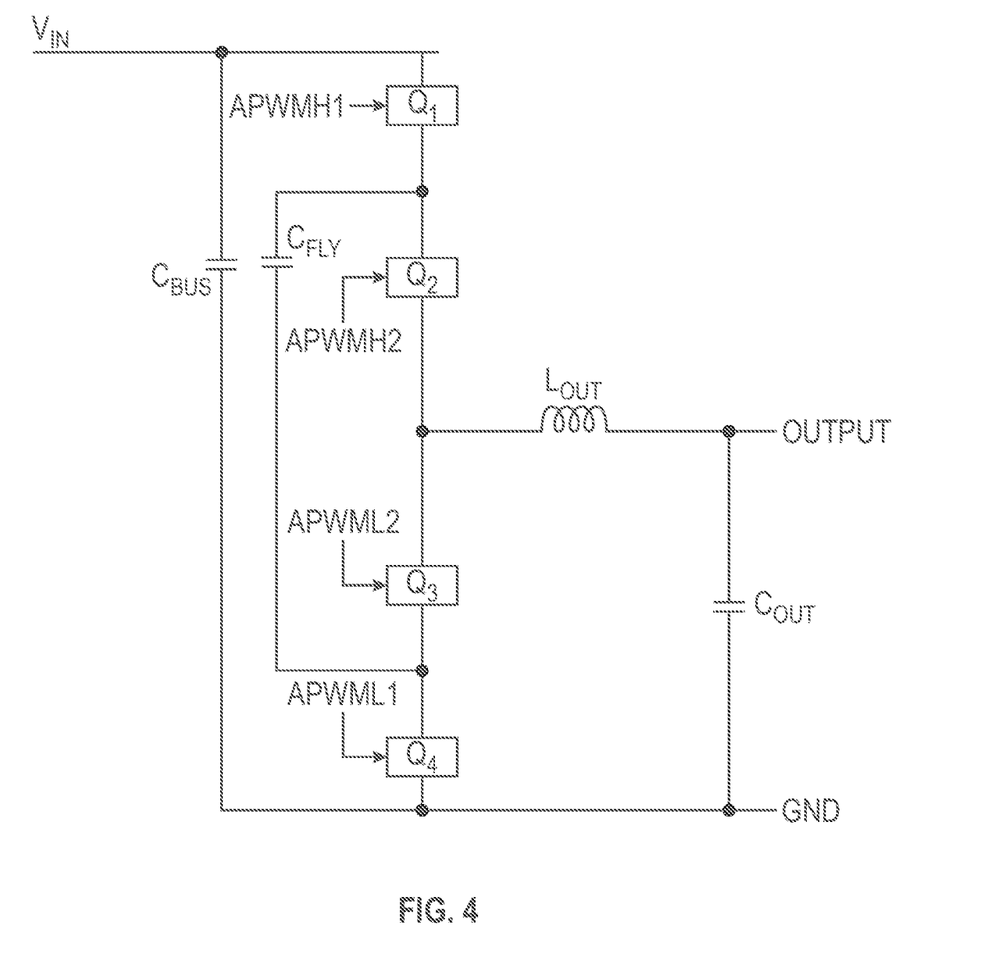
FIG. 4 is an illustration of an example application circuit to which an apparatus may provide PWM signals, according to examples of the present disclosure.

FIG. 4 is an illustration of an example application circuit 400 to which apparatus 100 may provide PWM signals, according to examples of the present disclosure. In particular, multiple instances of apparatus 100 may provide multiple instances of APWMH and APWML signals to control switches within the example application circuit 400. Application circuit 400 may be a three-level voltage converter utilizing a split half-bridge circuit.

In application circuit 400, a VIN input may be input into application circuit 400. A series of switches, Q1, Q2, Q3, Q4 may be connected in series from top to bottom. Q1 may be controlled by the PWM signal APWMH1, and Q4 may be controlled by the counterpart PWM signal APWML1. Q2 may be controlled by the PWM signal APWMH2, and Q3 may be controlled by the counterpart PWM signal APWML2. A flyback capacitor CFLY may be connected across Q2 and Q3. An input or bus capacitor CBUS may be connected across Q1 and Q4. An output inductor LOUT may be connected from a midpoint between Q2 and Q3 to an output of application circuit 400. An output capacitor COUT may be connected between the output and ground.

The operation of outputting voltage from application circuit 400 may be made by charging and discharging flying capacitor CFLY.

Figure 5:
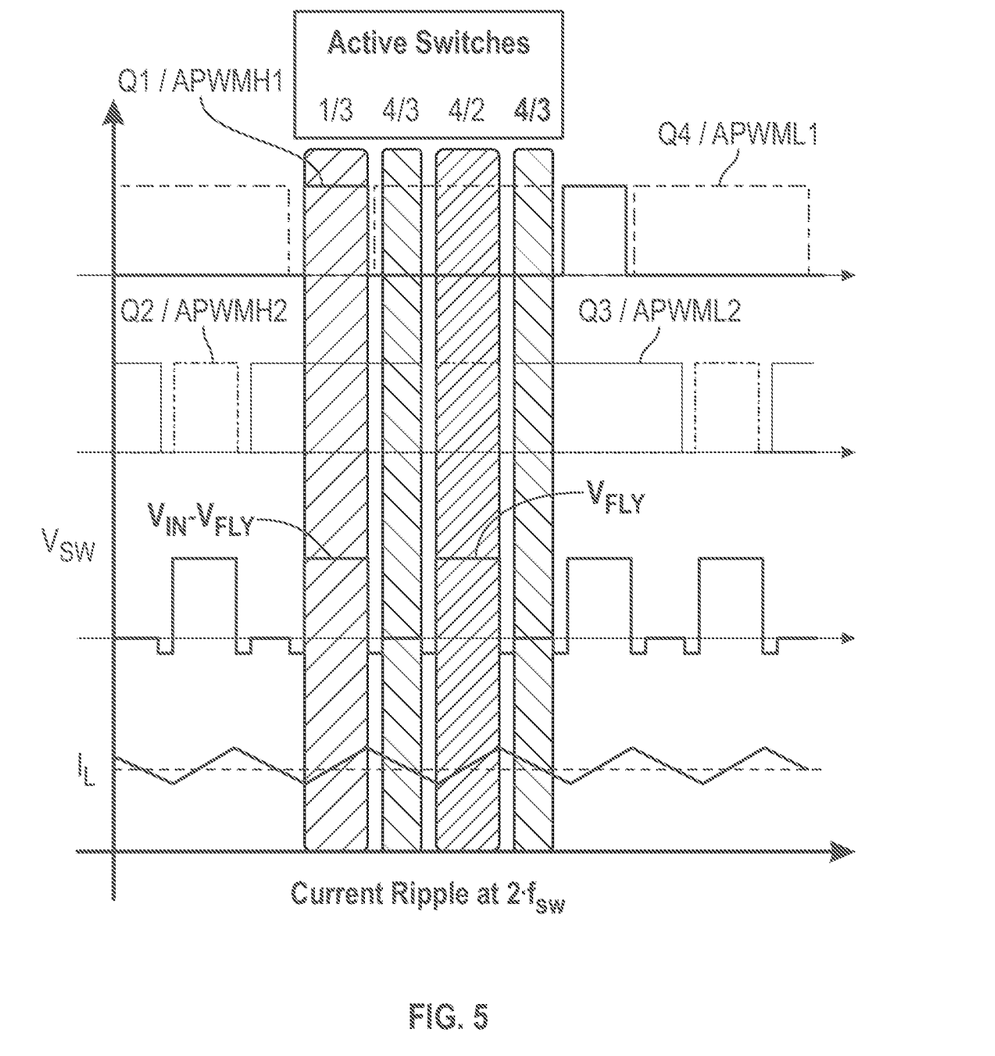
FIG. 5 is an illustration of operation of an example application circuit, according to examples of the present disclosure.

FIG. 5 is an illustration of operation of example application circuit 400, according to examples of the present disclosure. In particular, FIG. 5 illustrates timing of signals generated by application using PWM signals from apparatus 100 that are not yet overridden, but may be overridden. During different phases of operation, different ones of Q1-Q4 may be activated.

In a first phase, Q1 and Q3 may be activated while Q2 and Q4 are deactivated. In this first phase, flying capacitor CFLY may be charged up to VIN.

In a second phase, Q4 and Q3 may be activated while Q1 and Q2 are deactivated.

In a third phase, Q4 and Q2 may be activated while Q1 and Q3 are deactivated. This may be the converse of the first phase.

In a fourth phase, Q4 and Q3 may be activated while Q1 and Q2 are deactivated. This may be a same operation as in the second phase.

Figure 6:
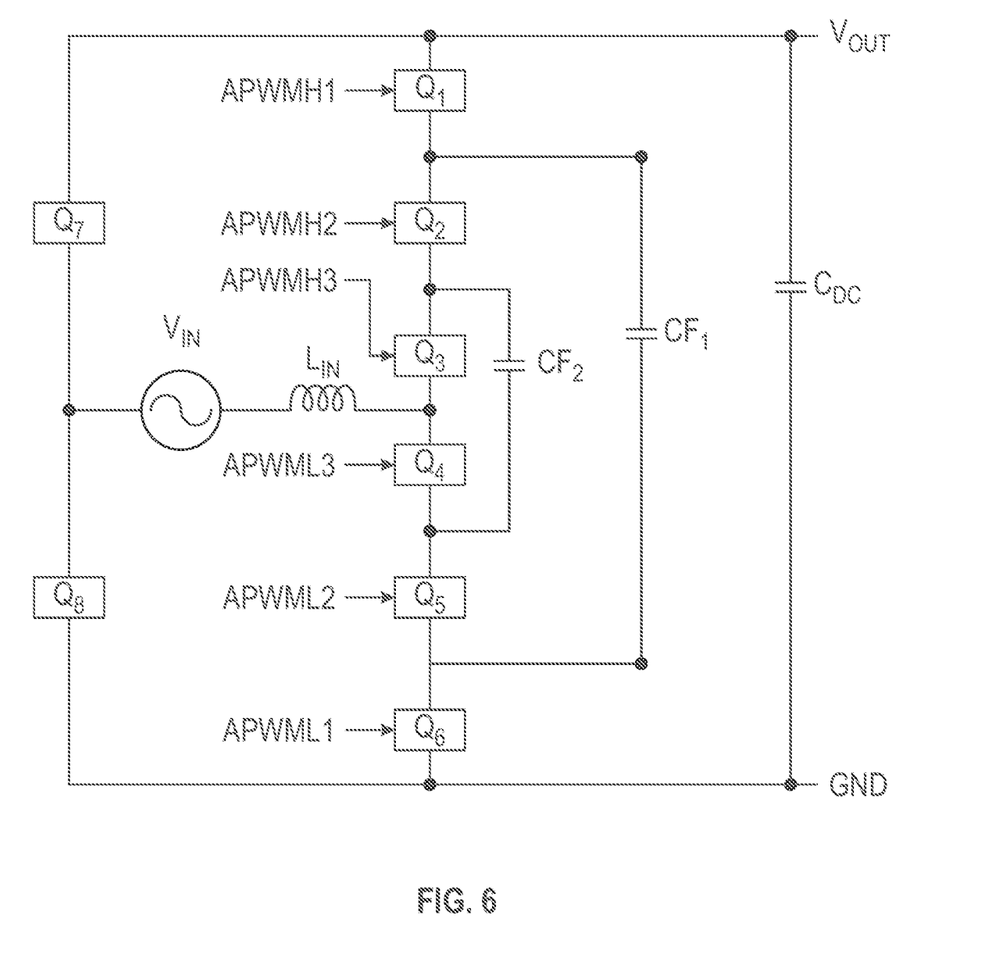
FIG. 6 is an illustration of an example application circuit to which an apparatus may provide PWM signals, according to examples of the present disclosure.

FIG. 6 is an illustration of an example application circuit 600 to which apparatus 100 may provide PWM signals, according to examples of the present disclosure. In particular, multiple instances of apparatus 100 may include multiple instances of APWMH and APWML signal to control switches within the example application circuit 600. In particular, multiple instances of apparatus 100 may provide multiple instances of APWMH and APWML signals to control switches within the example application circuit 400. Application circuit 600 may be a four-level totem-pole power factor correction circuit.

In application circuit 600, a series of six switches Q1, Q2, Q3, Q4, Q5, Q6 may be connected in series from top to bottom, and may form a bridge. In parallel, two switches Q7 and Q8 may be connected in series with each other. A voltage source VIN may be connected between a midpoint of Q7 and Q8 at a first end of voltage source VIN and a first end of input inductor LIN on a second end of voltage source VIN. A second end of input inductor LIN may be connected to a midpoint of Q3 and Q4. These switches Q7, Q8, VIN, and LOUT may together form a rectifier. A flyback capacitor CF1 may be connected between a midpoint of Q1 and Q2 on a first end and a midpoint of Q5 and Q6 on a second end. A flyback capacitor CF2 may be connected between a midpoint of Q2 and Q3 on a first end and a midpoint of Q4 and Q5 on a second end. An output capacitor, CDC, may be connected between output and ground.

Q1 may be controlled by the PWM signal APWMH1, and Q6 may be controlled by the counterpart PWM signal APWML1. Q2 may be controlled by the PWM signal APWMH2, and Q5 may be controlled by the counterpart PWM signal APWML2. Q3 may be controlled by the PWM signal APWMH3, and Q4 may be controlled by the counterpart PWM signal APWML3.

Figure 7:
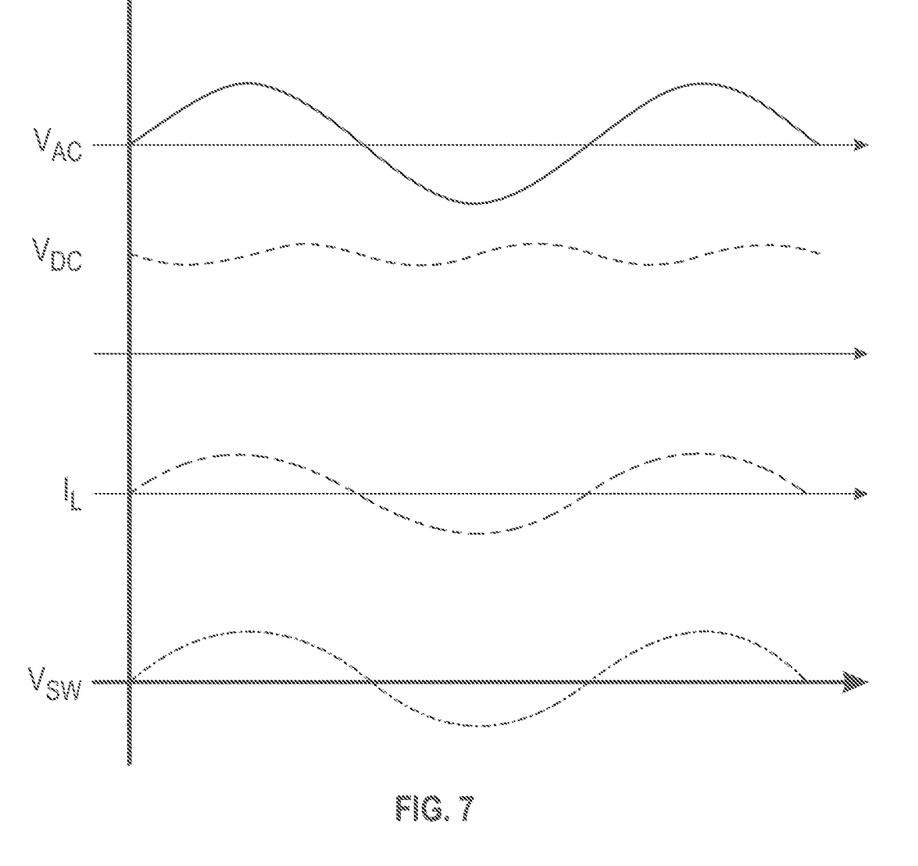
FIG. 7 is an illustration of operation of an example application circuit, according to examples of the present disclosure.

FIG. 7 is an illustration of operation of example application circuit 600, according to examples of the present disclosure. Illustrated are VAC produced by VIN, VDC output from application circuit 600, the current through LIN, and switching voltage (VSW).

In application circuit 600, it may be important to properly balance the voltage of flying capacitors CF1, CF2 in order to achieve low total harmonic distortion (THD) of the input of the power supply. During level transitions of switching voltage VSW, wherein distinctly different voltage levels may be produced as VOUT, VFCAP representing voltage across flying capacitors CF1 and CF2 in FIG. 6 may become distorted through parasitic resistance. Distortions may lead to oscillations in voltage balancing, which might otherwise need to be actively compensated.

Figure 8:
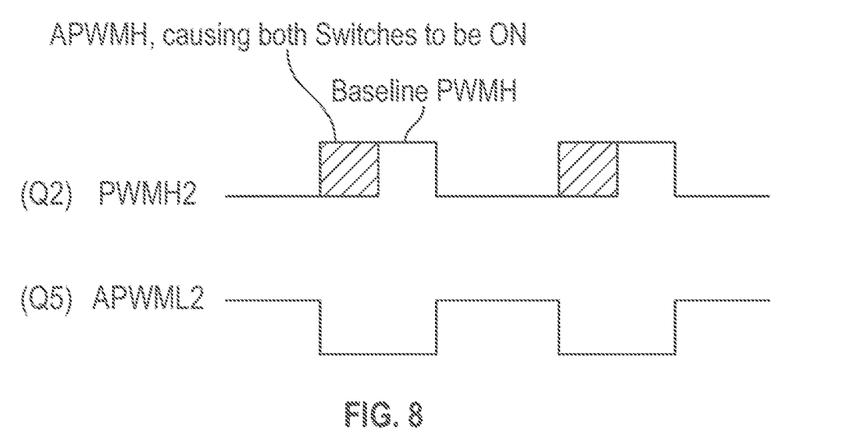
FIG. 8 is an illustration of operation of an apparatus to provide override signals to example application circuit 600 to which apparatus 100 may provide PWM signals, according to examples of the present disclosure.

FIG. 8 is an illustration of operation of apparatus 100 to provide override signals to example application circuit 600 to which apparatus 100 may provide PWM signals, according to examples of the present disclosure. FIG. 8 may illustrate how both switches of a given complementary pair might be active at a same time through action of override circuit 104. Shown in FIG. 8 is the control of switches Q2 and Q5. PWMH2 signal is shown as control of Q2 as a baseline, without override. APWML2 signal is shown as control of Q5, though PWML2 would be the same signal. Override circuit 104 may augment PWMH2 to include the shaded portion shown in FIG. 8 to yield APWMH2 signal, wherein overlap may occur with APWML2 signal such that both switches Q2 and Q5 may be activated at a same time. There may be no risk of shoot-through current when both Q2 and Q5 are activated at a same time, because capacitors may be charged rather than a short being caused. The overlapping switch times may shorten flying capacitor centering startup voltage. The capacitors are to produce positive and negative sine waves, so the capacitors need to be completely discharged, or, discharged to a known half charge, or at a deterministic beginning point. The overlapping switch time may make the time to reach such a deterministic beginning point do this shorter.

Figure 9:
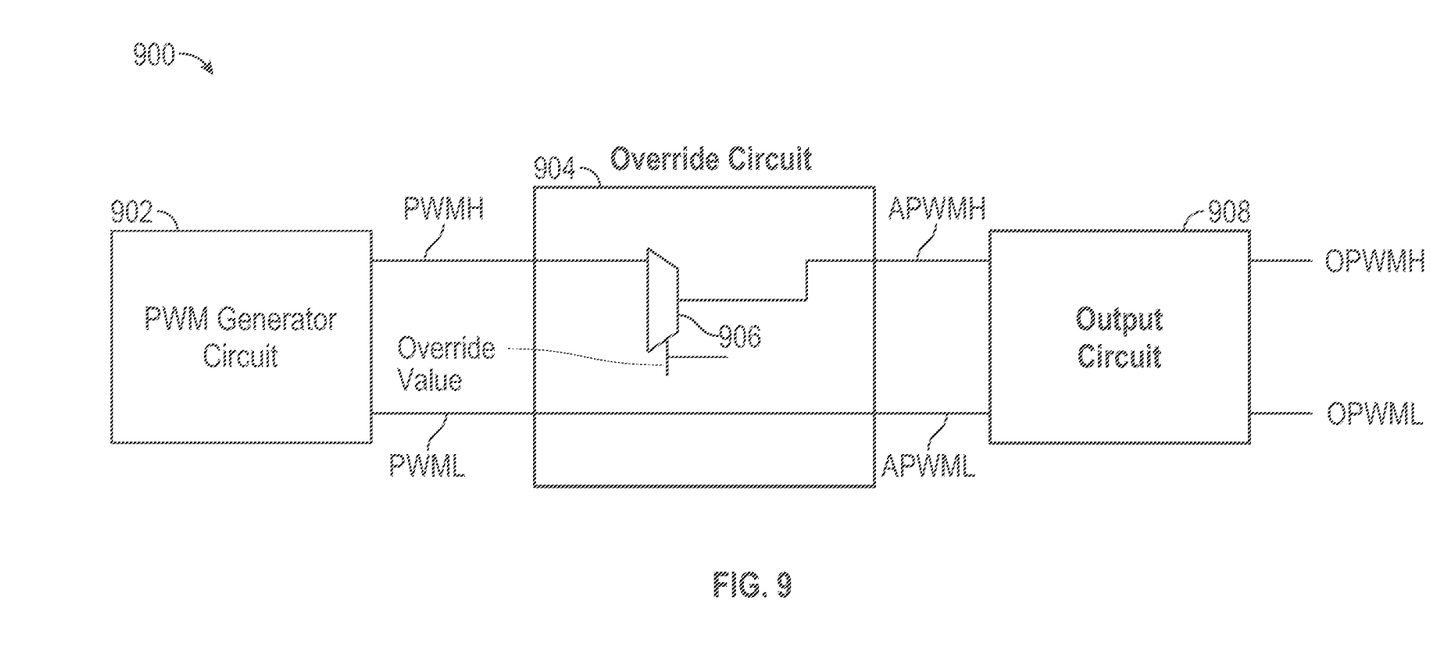
FIG. 9 is an illustration of an example system for override of PWM operating to generate generally complementary PWM signals, according to examples of the present disclosure.

FIG. 9 is an illustration of an example system 900 for override of PWM operating to generate generally complementary PWM signals, according to examples of the present disclosure. System 900 may include a PWM generator circuit 902, an override circuit 904, and an output circuit 908. PWM generator circuit 902 and override circuit 902 may implement or be implemented by, fully or in part, PWM generator circuit 102 and override circuit 104. PWM generator circuit 902, an override circuit 904, and an output circuit 908 may be implemented in any suitable manner, such as by analog circuitry, digital circuitry, instructions for execution by a processor (not shown), application specific integrated circuit, field programmable gate array, programmable logic, programmable hardware, programmable logic device, or any suitable combination thereof.

PWM generator circuit 902 may generate a first PWM signal, such as PWMH, and a second PWM signal, such as PWML. Signals PWHM and PWML may be generally complementary to each other in respect to their active portions.

Override circuit 904 may receive signals PWMH and PWML and output adjusted PWM signals such as APWMH and APWML based on PWMH and PWML to output circuit 908.

Output circuit 908 may output a first PWM output signal, such as OPWMH, and a second PWM output signal, such as OPWML. These may be provided to, for example, complementary pairs of switches. Output circuit 908 may perform various signal conditioning, such as adjusting the relative polarity of its input PWM signals.

Override circuit 904 may select between a first override value or the first PWM signal such as PWMH to provide to the output circuit an adjusted PWM signal as APWMH. Override circuit 904 may perform this by, for example, using a multiplexer 806 or any other suitable mechanism. Thus, output circuit 908 may output the first output PWM signal such as OPWMH based upon the first adjusted PWM signal such as APWMH based upon a selected one of the first override value or the first PWM signal such as PWMH from PWM generator circuit 902.

Figure 10A:
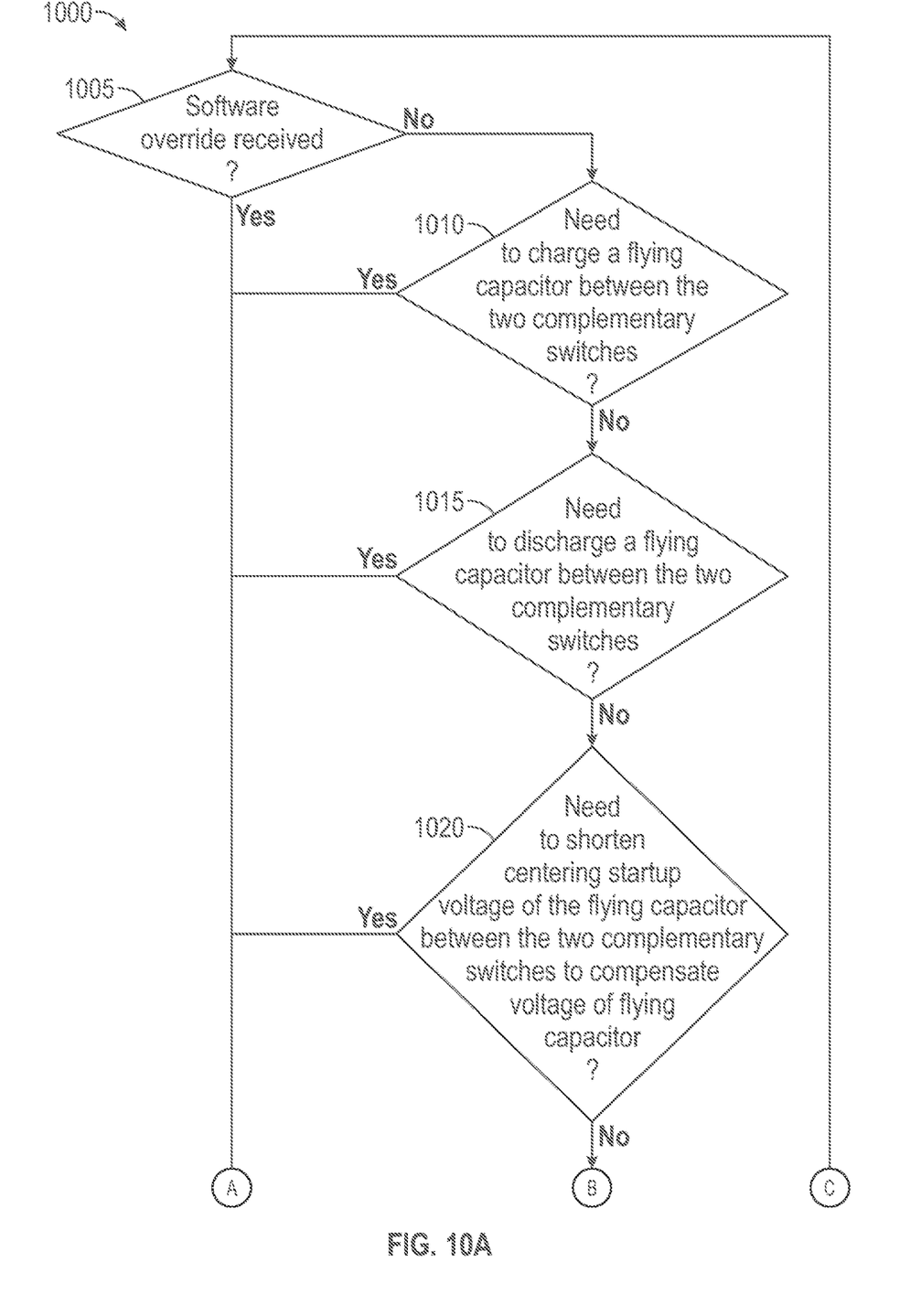
FIGS. 10A and 10B are illustrations of an example method for override of PWM operation in complementary mode, according to examples of the present disclosure.
Figure 10B:
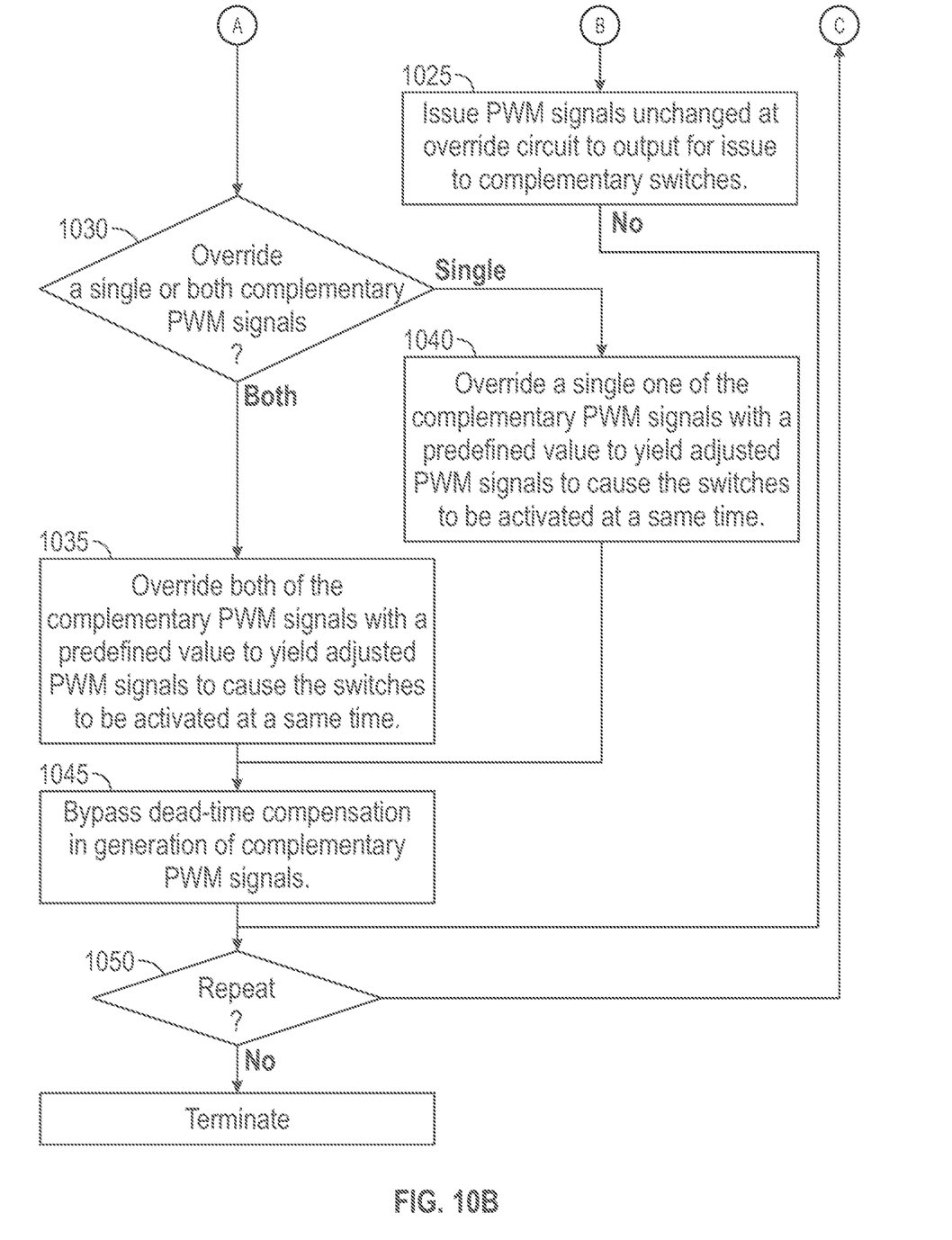

FIGS. 10A and 10B are illustrations of an example method 1000 for override of PWM operation in complementary mode, according to examples of the present disclosure. Method 1000 may be performed by any suitable elements, such as those of control circuits as shown in FIGS. 1-3, 9. Method 1000 may be executed with more or fewer steps than shown in FIG. 10, and the steps of method 1000 may be optionally omitted, repeated, performed in a different order, performed in parallel, or recursively.

Method 1000 may begin at any suitable point. Specifically, a determination to override a given PWM signal may be made on any suitable basis. In FIG. 10, such determinations may be made by any suitable one of 1005, 1010, 1015, or 1020. These may be performed in parallel with one another, or in any suitable order.

At 1005, for example, it may be determined whether a software override of PWM generation has been received. If so, method 1000 may proceed to 1030. Otherwise, method 1000 may proceed to 1010.

At 1010, it may be determined whether there is a need to charge a flying capacitor connected between two complementary switches that receive the PWM signals. If so, method 1000 may proceed to 1030. Otherwise, method 1000 may proceed to 1015.

At 1015, it may be determined whether there is a need to discharge a flying capacitor connected between two complementary switches that receive the PWM signals. If so, method 1000 may proceed to 1030. Otherwise, method 1000 may proceed to 1020.

At 1020, it may be determined whether there is a need to shorten a centering startup voltage of a flying capacitor connected between two complementary switches that receive the PWM signals, in order to compensate for voltage of the flying capacitor. If so, method 1000 may proceed to 1030. Otherwise, method 1000 may proceed to 1025.

At 1025, the PWM signals that were generated may be output from the override circuit unchanged. The PWM signals may be output for issue to the complementary switches. Method 1000 may proceed to 1050.

At 1030, it may be determined whether a single one or both of the complementary PWM signals is to be overridden. If both are to be overridden, method 1000 may proceed to 1035. If a single one is to be overridden, method 1000 may proceed to 1040.

At 1035, both of the PWM signals may be overridden. They may be overridden with a predefined value. The predefined value may cause the respective switches to be activated. The process may yield adjusted PWM signals to cause the switches to be activated at a same time. Method 1000 may proceed to 1045.

At 1040, a single one of the PWM signals may be overridden, sufficient to cause both switches to be activated at a same time. The signal may be overridden with a predefined value. The predefined value may cause the respective switch to be activated. The process may yield adjusted PWM signals to cause the switches to be activated at a same time. Method 1000 may proceed to 1045.

At 1045, dead-time compensation may be bypassed in generation of PWM signals for those signals that are overridden. Method 1000 may proceed to 1050.

At 1050, it may be determined whether method 1000 will repeat. If so, method 1000 may repeat at, for example, 1005. Otherwise, method 1000 may terminate.

Examples of the present disclosure may include an apparatus. The apparatus may include a PWM generator circuit to generate generally complementary PWM signals. The signals may be to prevent two complementary switches that receive the complementary PWM signals from both being activated at a same time. The PWM signals may be generally complementary with respect to their active portions. The apparatus may include an override circuit to override at least one of the complementary PWM signals to yield adjusted PWM signals. The adjusted PWM signals may cause the two complementary switches to be activated at a same time when the adjusted PWM signals are received at the two complementary switches.

In combination with any of the above embodiments, the override circuit is to override the complementary PWM signals to yield the adjusted PWM signals based on a software override.

In combination with any of the above embodiments, the override circuit may be to override the complementary PWM signals to yield the adjusted PWM signals to activate both of the two complementary switches to charge a flying capacitor connected between the two complementary switches.

In combination with any of the above embodiments, the override circuit may be to override the complementary PWM signals to yield the adjusted PWM signals to activate both of the two complementary switches to discharge a flying capacitor connected between the two complementary switches.

In combination with any of the above embodiments, the override circuit may be to override the complementary PWM signals to yield the adjusted PWM signals to activate both of the two complementary switches to actively compensate voltage of a flying capacitor connected between the two complementary switches.

In combination with any of the above embodiments, the override circuit may be to actively compensate voltage of the flying capacitor connected between the two complementary switches by shortening a centering startup voltage of the flying capacitor.

In combination with any of the above embodiments, the override circuit may be to bypass dead-time compensation to generate at least one of the complementary PWM signals.

In combination with any of the above embodiments, the override circuit may be to override a single one of the complementary PWM signals to yield the adjusted PWM signals.

In combination with any of the above embodiments, the override circuit may be to override one of the complementary PWM signals with a predefined value to yield the adjusted PWM signals.

Examples of the present disclosure may include a system. The system may include any of the apparatuses of the above examples. The PWM generator circuit may be to generate a first PWM signal and a second PWM signal. The first and second PWM signals may be generally complementary to each other with respect to their active portions. The system may include an output circuit to output a first output PWM signal and a second output PWM signal. The system may include an override circuit to select between a first override value or a first adjusted PWM signal to provide to the output circuit. The output circuit may be to output the first output PWM signal based upon the first adjusted PWM signal based upon a selected one of the first override value or the first adjusted PWM signal from the override circuit.

The PWM generator circuits, override circuits, and output circuits of any of the above examples may be implemented in any suitable manner, such as by analog circuitry, digital circuitry, instructions for execution by a processor (not shown), application specific integrated circuit, field programmable gate array, programmable logic, programmable hardware, programmable logic device, or any suitable combination thereof.

In combination with any of the above embodiments, the override circuit may be to turn off an addition of deadtime to the first PWM signal based on a determination to select the first override value to be provided to the output circuit.

Examples of the present disclosure may include methods performed by any of the above examples.

Although examples have been described above, other variations and examples may be made from this disclosure without departing from the spirit and scope of these examples.

The invention claimed is:

1. An apparatus, comprising:
a pulsed-width modulation (PWM) generator circuit to generate generally complementary PWM signals, the signals to prevent two complementary switches that receive the complementary PWM signals from both being activated at a same time, the PWM signals being generally complementary with respect to their active portions; and
an override circuit to override at least one of the complementary PWM signals to yield adjusted PWM signals, the adjusted PWM signals to cause the two complementary switches to be activated at a same time when the adjusted PWM signals are received at the two complementary switches.

2. The apparatus of claim 1, wherein the override circuit is to override the complementary PWM signals to yield the adjusted PWM signals based on a software override.

3. The apparatus of claim 1, wherein the override circuit is to override the complementary PWM signals to yield the adjusted PWM signals to activate both of the two complementary switches to charge a flying capacitor connected between the two complementary switches.

4. The apparatus of claim 1, wherein the override circuit is to override the complementary PWM signals to yield the adjusted PWM signals to activate both of the two complementary switches to discharge a flying capacitor connected between the two complementary switches.

5. The apparatus of claim 1, wherein the override circuit is to override the complementary PWM signals to yield the adjusted PWM signals to activate both of the two complementary switches to actively compensate voltage of a flying capacitor connected between the two complementary switches.

6. The apparatus of claim 5, wherein the override circuit is to actively compensate voltage of the flying capacitor connected between the two complementary switches by shortening a centering startup voltage of the flying capacitor.

7. The apparatus of claim 1, wherein the override circuit is to bypass dead-time compensation to generate at least one of the complementary PWM signals.

8. The apparatus of claim 1, wherein the override circuit is to override a single one of the complementary PWM signals to yield the adjusted PWM signals.

9. The apparatus of claim 1, wherein the override circuit is to override one of the complementary PWM signals with a predefined value to yield the adjusted PWM signals.

10. A method, comprising:
generating generally complementary pulsed-width modulation (PWM) signals, the PWM signals being generally complementary with respect to their active portions, the complementary PWM signals to prevent two complementary switches that receive the complementary PWM signals from both being activated at a same time; and
overriding at least one of the complementary PWM signals to yield adjusted PWM signals, the second adjusted PWM signals to cause the two complementary switches to be activated at a same time when the second adjusted PWM signals are received.

11. The method of claim 10, wherein overriding the complementary PWM signals to yield the adjusted PWM signals is based on a software override.

12. The method of claim 10, wherein overriding the complementary PWM signals to yield the adjusted PWM signals is to activate both of the two complementary switches to charge a flying capacitor connected between the two complementary switches.

13. The method of claim 10, wherein overriding the complementary PWM signals to yield the adjusted PWM signals is to activate both of the two complementary switches to discharge a flying capacitor connected between the two complementary switches.

14. The method of claim 10, wherein overriding the complementary PWM signals to yield the adjusted PWM signals is to activate both of the two complementary switches to actively compensate voltage of a flying capacitor connected between the two complementary switches.

15. The method of claim 14, comprising shortening a centering startup voltage of the flying capacitor to actively compensate voltage of the flying capacitor connected between the two complementary switches.

16. The method of claim 10, comprising bypassing dead-time compensation to generate the complementary PWM signals to yield the adjusted PWM signals.

17. The method of claim 10, comprising overriding a single one of the complementary PWM signals to yield the adjusted PWM signals.

18. The method of claim 10, comprising overriding one of the complementary PWM signals with a predefined value to yield the adjusted PWM signals.

19. A system, comprising:
a pulsed-width modulation (PWM) generator circuit to generate a first PWM signal and a second PWM signal, the first and second PWM signals to be generally complementary to each other with respect to their active portions;
an output circuit to output a first output PWM signal and a second output PWM signal; and
an override circuit to select between a first override value or a first adjusted PWM signal to provide to the output circuit;
wherein the output circuit is to output the first output PWM signal based upon the first adjusted PWM signal based upon a selected one of the first override value or the first adjusted PWM signal from the override circuit.

20. The system of claim 19, wherein the override circuit is to turn off an addition of deadtime to the first PWM signal based on a determination to select the first override value to be provided to the output circuit.

* * * * *